United States Patent [19]
Reinhardt

[11] Patent Number: 5,673,006
[45] Date of Patent: Sep. 30, 1997

[54] SEAMLESS SWITCH-OVER FREQUENCY SYNTHESIZER

[75] Inventor: Victor S. Reinhardt, Rancho Palos Verdes, Calif.

[73] Assignee: Hughes Electronics, Los Angeles, Calif.

[21] Appl. No.: 623,442

[22] Filed: Mar. 28, 1996

[51] Int. Cl.$^6$ .................................................. H03L 7/26
[52] U.S. Cl. .................................. 331/3; 331/11; 331/14; 331/17; 331/25; 331/44
[58] Field of Search .................................. 331/3, 11, 14, 331/16, 17, 25, 44

[56] References Cited

U.S. PATENT DOCUMENTS 4,188,582 2/1980 Cannalte et al. ........................... 455/92
5,168,478 12/1992 Baker ......................................... 368/202

Primary Examiner—Siegfried H. Grimm
Attorney, Agent, or Firm—P. Y. Price; T. Gudmestad; W. K. Denson-Low

[57] ABSTRACT

A frequency synthesizer having two atomic frequency standard inputs that is adapted to provide seamless switching or transition between the atomic frequency standard inputs with no change in the synthesizer output phase and frequency. The synthesizer includes a multichannel phase comparison system, each channel adapted for handling an atomic frequency standard input, a digital phase lock loop, a digital to analog converter, and a voltage controlled crystal oscillator which provides the synthesizer output. The phase comparison system is adapted to continually monitor the integrity of the atomic frequency standard inputs and to continually estimate the phase differences between the two atomic frequency standard inputs. The phase difference is used to estimate the proper phase and frequency offset between the primary and secondary inputs. The programmatically determined phase offset and the fractional frequency offset are then passed to the phase lock loop when switch-over is commanded to produce an output signal that tracks the phase of the original primary input.

17 Claims, 6 Drawing Sheets

SEAMLESS SWITCH-OVER FREQUENCY SYNTHESIZER

BACKGROUND OF THE INVENTION

The present invention relates to frequency synthesizers, and more particularly to frequency synthesizers utilized in tracking atomic standards the output of which exhibits seamless switch-over upon a change or transfer in atomic frequency input standards.

Frequency synthesizers are one of the basic building blocks of precision timekeeping systems. Most timekeeping systems are designed with sufficient redundancy of atomic frequency standard (AFS) inputs so that a single point failure in an AFS device will not disrupt normal operation of the timekeeping system. Switch-over is the process wherein the synthesizer swaps the AFS inputs and is typically done in case of a hard failure of the AFS input or an impending failure of the AFS input. Unfortunately, since the AFS inputs each have differing phases and frequencies, a time error is generated whenever switch-over occurs.

There are a variety of other synthesizers currently utilized in tracking atomic standards, none of which are known to provide seamless transfer from one atomic standard to another atomic standard. Much of the prior art has attempted to minimize the time error that occurs at switch-over by employing LC filters and other specialized techniques which allows the timekeeping system to react accordingly. Nevertheless, there is usually some adverse impact resulting from the switch-over. In addition, none of the related art AFS synthesizers are known to have the capability to monitor two or more AFS inputs concurrently, which may tend to provide earlier detection of problems with the AFS inputs.

Accordingly, there is a need to provide a seamless switch-over frequency synthesizer adapted for tracking atomic frequency standard inputs. The seamless switch-over frequency synthesizer should minimize the impacts of switching between AFS inputs. In other words, the output of the synthesizer should present no change in phase or frequency at switch-over regardless of the phase and frequency differences between the switched inputs.

Further, there is a continuing need to provide an improved AFS tracking synthesizer that allows extensive diagnostics to be performed on two or more AFS inputs without interrupting or disturbing the tracking configuration of the synthesizer.

SUMMARY OF THE INVENTION

The present invention advantageously addresses the above-identified needs as well as other needs by providing a seamless switch-over frequency synthesizer having a plurality of atomic frequency standard inputs and an output that tracks the phase of one of the atomic frequency standard inputs. The configuration of the synthesizer allows for seamless switching or transition between atomic frequency standard inputs with no change in the synthesizer output phase and frequency. In particular, the frequency synthesizer comprises a multichannel phase comparison circuit with each channel adapted for handling atomic frequency standard inputs, a digital phase lock loop circuit, a digital to analog converter, and a voltage controlled crystal oscillator which provides the synthesizer output. The phase comparison system is adapted to continually monitor the integrity of the atomic frequency standard inputs and to continually estimate the phase differences between the two atomic frequency standard inputs. The phase difference is then used to estimate the proper phase and frequency offset between the primary and secondary inputs. The programmatically determined phase offset and the fractional frequency offset are then passed to the phase lock loop when switch-over is commanded and produces an output signal that tracks the phase of the original primary input.

The invention may also be characterized as a frequency synthesizer that, in addition to generating an output signal having a selected frequency and phase that tracks a reference atomic frequency standard input, further includes various diagnostic capabilities adapted for monitoring the phase and frequency of several atomic frequency standard input devices or units independent of the synthesizer tracking configuration. This diagnostic function of the present invention provides early detection of atomic frequency standard device problems and allows spare atomic frequency standard units to be exercised and tested without disturbing normal synthesizer operations. When a problem is detected within an atomic frequency standard unit, the suspect atomic frequency standard unit is taken off-line and the synthesizer provides an automatic and seamless switch-over to a spare or secondary atomic frequency standard unit, if necessary.

In another aspect of the invention, the invention may be characterized as a timekeeping system adapted for use in a satellite system or other complex system that utilizes precise time references. The presently disclosed timekeeping system utilizes two or more atomic frequency standard inputs and produces a clock output that tracks the phase of one of the atomic frequency standard inputs. The timekeeping system includes an atomic frequency standard selector switch for routing at least two atomic frequency standard inputs to a phase comparison subsystem, a digital phase lock loop circuit, a digital to analog converter, a voltage controlled crystal oscillator which provides the prescribed clock output, and a clock output distribution network. Control of the timekeeping system can be effectuated by means of an appropriate control unit that directs the sequence of operations, interprets appropriate input command signals and routes the proper signals to the timekeeping system circuitry to carry out the instructions.

Finally, the invention may be characterized as a method of switching from a primary atomic frequency standard input to a spare atomic frequency standard input in a timekeeping system without affecting the phase and frequency of the synthesized output. This method of seamlessly switching from a primary atomic frequency standard input to a spare atomic frequency standard input can be done as part of routine diagnostic functions (preventative or corrective) or can be automatically invoked in the event of a hard failure of the primary atomic frequency standard input. The preferred method comprises the steps of (a) selecting a primary atomic frequency standard input and secondary atomic frequency standard input, (b) measuring the phase difference between the primary and secondary atomic frequency standard inputs, (c) estimating the proper phase and frequency offset between the primary and secondary inputs, (d) monitoring the integrity of the primary and secondary inputs and commanding switch-over whenever the integrity of the primary input is lost, (e) digitally phase locking a voltage controlled crystal oscillator output to the primary atomic frequency standard input based on the phase and frequency offset between the voltage controlled crystal oscillator output and the primary atomic frequency standard input in the absence of a switch-over command (i.e. when the integrity of the primary input is maintained), (f) digitally phase locking the voltage controlled crystal oscillator output to the original primary atomic frequency standard input based in part on the estimated phase and frequency offset between the primary and secondary inputs whenever switch-over is commanded, (g) converting the digitally phase locked signal to an analog voltage control signal, and (h) providing the voltage control signal to the voltage controlled crystal oscillator which provides the synthesizer output that tracks the phase of the primary input.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
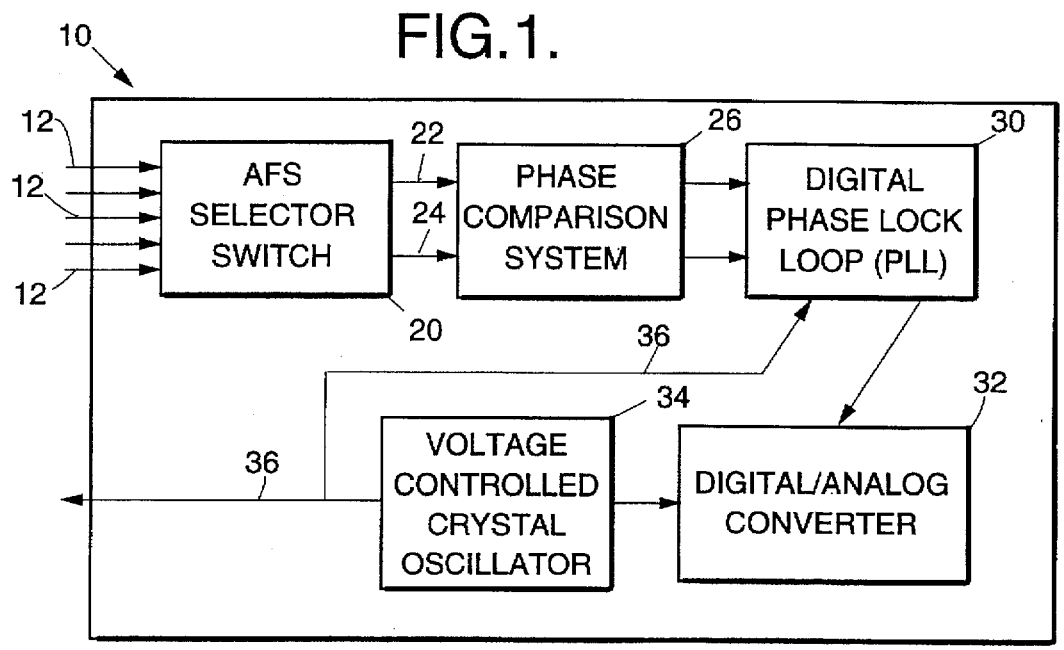
FIG. 1 is a simplified functional block diagram of the seamless switch-over synthesizer system.

Referring first to FIG. 1, there is shown a simplified block diagram of the seamless switch-over synthesizer system being generally designated by the numeral 10. As seen therein, the seamless switch-over frequency synthesizer system 10 is basically adapted to receive a plurality of atomic frequency standard (AFS) inputs 12 together with appropriate control commands and related data and produce an output signal that tracks the phase of a prescribed one of the AFS inputs, referred to as the master AFS. As such, the synthesizer system allows for seamless switching or transition between AFS inputs 12 with no change in the synthesizer output phase and/or frequency. The preferred embodiment of the seamless switch-over frequency synthesizer system includes an AFS selector switch 20 for selecting and routing two AFS inputs 22 and 24, one of which is the master AFS input 22 the other being a spare AFS input 24, from a plurality of AFS inputs 12 to a multichannel phase comparison circuit 26. The seamless switch-over frequency synthesizer system 10 further includes a precision digital phase lock loop circuit 30, a digital to analog converter 32, and a voltage controlled crystal oscillator 34 which provides the synthesizer output 36. The voltage controlled crystal oscillator 34 is further adapted to provide appropriate clocking and reference signals to various elements associated with the synthesizer system 10.

The phase comparison circuit 26 measures the phase difference between the master and spare AFS inputs and the phase difference between the master AFS input and reference oscillator. The digital phase lock loop circuit 30 which utilizes the phase difference between the master AFS input 22 and the voltage controlled crystal oscillator output 36 to digitally phase lock the oscillator output 36 to the master AFS input 22 prior to switch-over. The phase difference between the two AFS inputs 22 and 24 is then used to establish programmable phase and frequency offsets that are utilized at switch-over to produce a seamless or near seamless transition.

Figure 2:
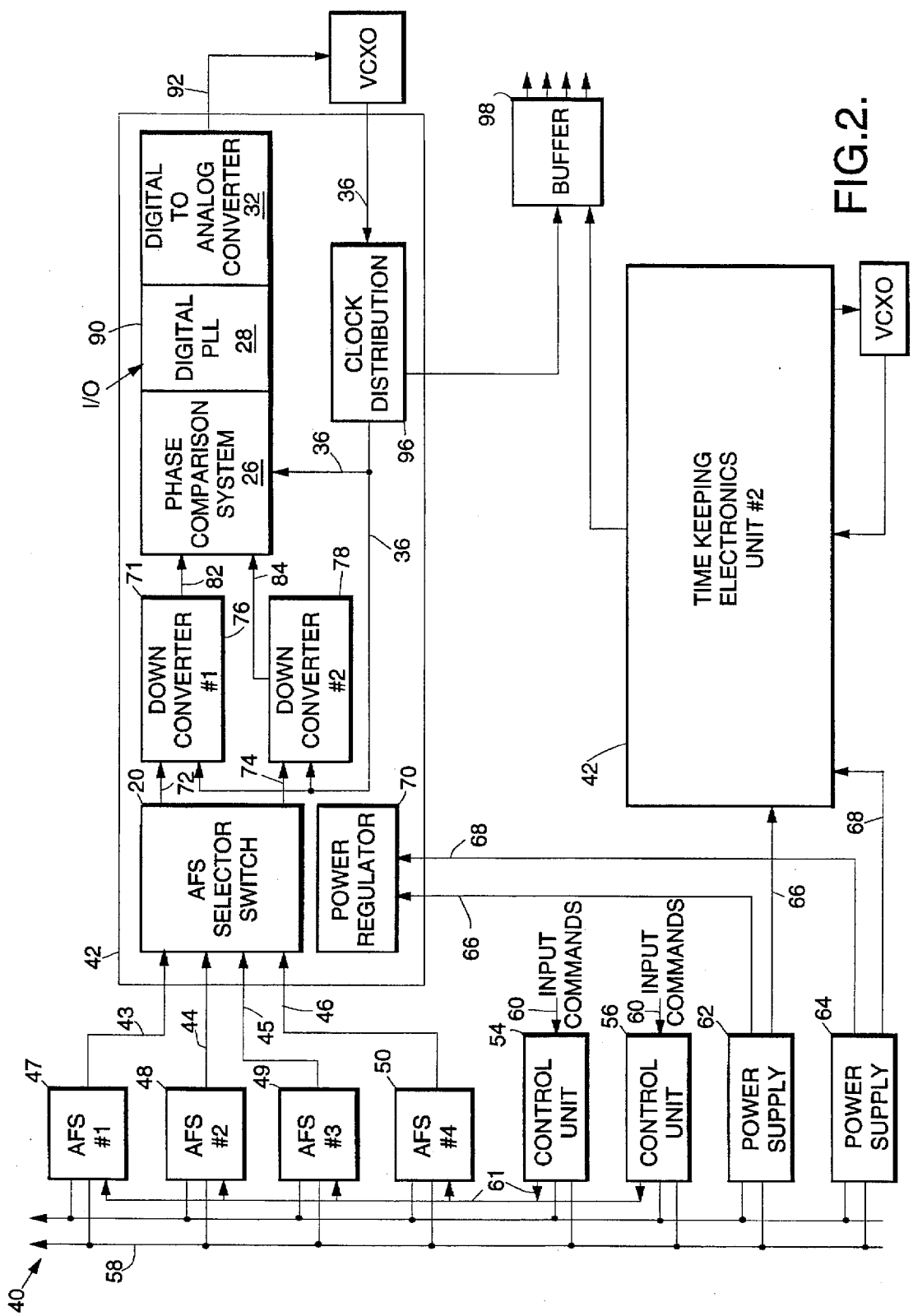
FIG. 2 is a detailed functional block diagram of an embodiment of the timekeeping system incorporating the seamless switch-over synthesizer system.

As indicated above, the seamless switch-over frequency synthesizer system 10 is particularly advantageous when incorporated within a timekeeping system of a satellite, i.e. Global Positioning Satellite (GPS), or other complex system that utilizes precise time references. Referring next to FIG. 2, there is shown a detailed functional block diagram of an embodiment of the timekeeping system 40 incorporating the seamless switch-over synthesizer system 10. In a satellite system that utilizes highly precise time references, such as GPS, the seamless switch-over synthesizer of the present invention allows switching between atomic references in the event of a failure in an atomic reference device. The switch-over or transitioning occurs without affecting the availability of the satellite system and without noticeable change or disturbance in timekeeping system 40 operation.

The timekeeping system 40 depicted in FIG. 2 is a redundant timekeeping system in that it utilizes two or more identical timekeeping electronic units 42 operating concurrently and using the same AFS inputs 43, 44, 45, 46. Specifically, the timekeeping system 40 of FIG. 2 utilizes four AFS input devices 47, 48, 49, 50 the signals of which are routed to an AFS selector switch 20. The four AFS input devices 47, 48, 49, 50 are effectively controlled from a pair of redundant control units 54, 56 and are powered from the satellite or spacecraft power bus 58. The first control unit 54 is adapted to accept and interpret appropriate input command signals 60 and routes the proper signal to each of the four AFS input devices 47, 48, 49, 50. The second control unit 56 is also adapted to accept and interpret the input command signals 60 and effectuate redundant control of all four of the AFS input devices 47, 48, 49, 50.

Each of the timekeeping electronic units 42 depicted in FIG. 2 are identical units that can operate independently and can also be operated concurrently with other timekeeping electronic units. It should be understood that while the following description addresses the structure and function of one of the timekeeping electronic units 42, the description is equally applicable to the other timekeeping electronic units 42.

With the foregoing in mind, reference is made again to FIG. 2 where it is shown that the first and second control units 54, 56 are adapted to control (i.e. turn on/off) the power supply 62, 64 for each of the timekeeping electronic units 42. The timekeeping electronic unit 42 is adapted to receive redundant power inputs 66, 68 from a pair of DC power supplies 62, 64. The timekeeping electronic unit 42 further includes the requisite power regulating circuits 70 (i.e. regulators and filters) to condition the input power to the desired level for each of the elements contained therein.

The four AFS inputs 43, 44, 45, 46 are routed to the AFS selector switch 20 which, in essence, is a matrix of relays operating under the control of the synthesizer control processor 90 via a selector switch control signal 71. The AFS selector switch 20 selects and passes two of the four AFS inputs 43, 44, 45, 46. through the timekeeping system. One of the selected AFS inputs is identified as the primary or master AFS input 72 whereas the other selected AFS input is identified as the secondary or spare AFS input 74. Each of the selected AFS inputs 72 and 74 are maintained as a separate channel as they are routed to the multichannel phase comparison circuit or equivalent phase comparison system 26 discussed above, with reference to FIG. 1.

The preferred embodiment of the multichannel phase comparison system includes a pair of downconverters 76 and 78 to reduce the frequency of the selected AFS inputs 72 and 74 and a phase comparison means implemented by means of a synthesizer control processor 90. Each downconverter 76 and 78 is adapted to accept as inputs one of the selected AFS input signals 72 or 74 at a frequency of 13.4 MHZ together with the output 36 of the voltage controlled crystal oscillator 34 at a frequency of 10.23 MHZ and produce a lower frequency output signal 82 and 84. Such downconverter frequency plan is accomplished using a plurality of mixers in a manner that is well known to those skilled in the art.

The remaining portion of the phase comparison system is incorporated within the synthesizer control processor 90 which is adapted to accept the pair of lower frequency output signals 82 and 84 from the downconverters 76 and 78 together with a reference signal 36 from the voltage controlled crystal oscillator 34 in order to determine the phase difference between the master AFS and the spare AFS as well as the phase difference between the master AFS and the voltage controlled crystal oscillator output signal. It is contemplated that a variety of other embodiments of the phase comparison system 26 can be used within the presently disclosed timekeeping system 40. What is important is the outputs of the phase comparison system provide the precise phase differences between the master AFS and spare AFS as well as between the master AFS and the voltage controlled crystal oscillator output signal.

The output signals from the phase comparison system 26 together with the downconverted AFS inputs are used by the digital phase lock loop 28 to digitally phase lock the voltage controlled crystal oscillator output 36 to the master AFS input under normal operating conditions. The loop output signal of the digital phase lock loop 28 is then routed to a digital to analog converter 32, preferably contained within the synthesizer control processor 90, to produce a voltage signal 92 which effectuates control of the voltage controlled crystal oscillator 34.

Moreover, the synthesizer control processor 90 retains the appropriate phase and frequency offsets between the two processed signals (downconverted signals from the two selected AFS inputs). The phase and frequency offsets between the two signals are utilized when the timekeeping system 40 is commanded to switch from the primary to the secondary AFS inputs to facilitate a seamless or near seamless transition. Thus, when a problem is detected within the master AFS input 72 or prescribed diagnostic functions need to be performed, the timekeeping system 40 can switch to the secondary or spare AFS input 74 and, because of the phase and frequency offsets, can do so without affecting the output 36 of the voltage controlled crystal oscillator 34.

The output 36 of the voltage controlled crystal oscillator 34 is routed to a clock distribution network 96 which then routes the signal 36 to designated paths including back to the downconverters 76 and 78 for use as a reference signal, back to the synthesizer control processor 90 for use as a clocking signal, and to an output distribution buffer 98 where the signal 36 is further routed to other components within the satellite system.

Figure 3:
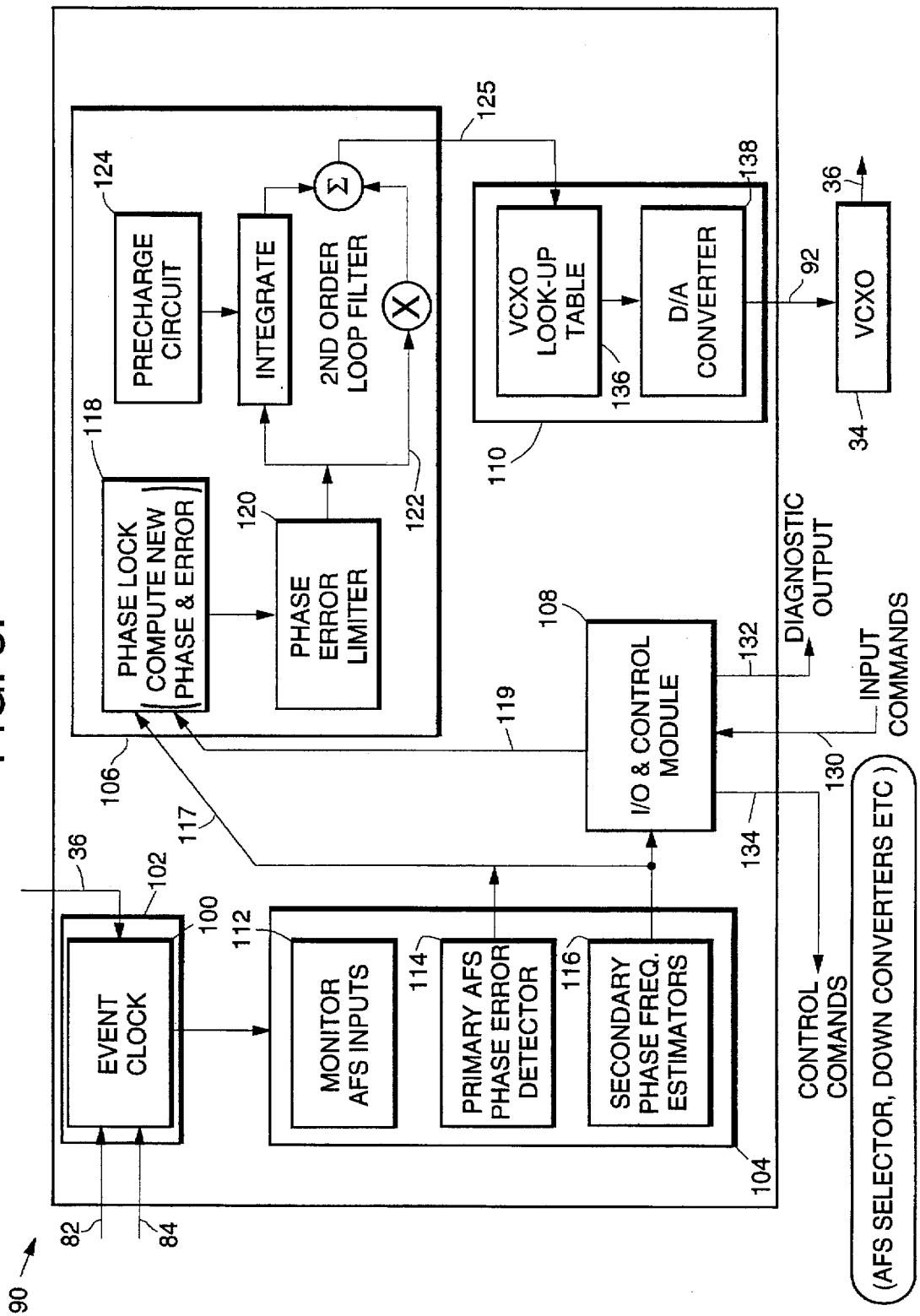
FIG. 3 is a functional block diagram of an embodiment of the seamless switch-over frequency synthesizer control processor of FIG. 2 adapted to accept input signals from the downconverters and provide a voltage signal output to the voltage controlled crystal oscillator.

Referring next to FIG. 3, there is shown a functional block diagram of the preferred embodiment of the synthesizer control processor 90. As indicated above, the synthesizer control processor 90 performs the three primary functions of the seamless switch-over synthesizer system, namely, the phase comparison functions, the digital phase lock loop functions, and digital to analog conversion functions. A good background discussion of the theory and operation of the phase comparison function as well as the digital phase lock loop function is presented in the publication authored by applicant V. Reinhardt and R. Costlow entitled "Frequency (Standard) Combiner Selector", Proceedings of the 37th Frequency Control Symposium (IEEE/ERADCOM, Philadelphia), 1983, the disclosure of which is incorporated by reference herein.

Before describing the details associated with the synthesizer control processor 90, it is helpful to review some pertinent frequency standard theory. It is well known that the output of a frequency standard can be described by:

$$V = A \sin[2\pi f_0 + \phi(t)]$$

where $f_o$ is the nominal or ideal frequency and $\phi(t)$ describes all the phase deviations from ideal behavior. One can show that if this frequency standard is used to drive a timekeeping system that, at any instant, the error is given by:

$$x(t) = \frac{\phi(t)}{2\pi f_0}$$

where x is called the normalized phase error. By taking the time derivative of $\phi$, one obtains the instantaneous angular frequency offset from $2\pi f_0$:

$$\frac{d\phi}{dt} = \dot{\phi} = 2\pi \delta f(t)$$

Dividing this by $2\pi f_0$ yields the instantaneous fractional frequency error:

$$y = \frac{\delta f}{f_0} = \frac{\dot{\phi}}{2\pi f_0} = \frac{dx}{dt} = \dot{x}$$

That is, the instantaneous fractional frequency offset, y, is the time derivative of the phase error, x. Averaging y over some time $\tau$ yields the important relation:

$$\bar{y}(t+\tau, t) = \frac{x(t+\tau) - x(t)}{\tau}$$

With the foregoing in mind, the synthesizer control processor can be described.

The synthesizer control processor 90 receives input signals 82 and 84 from the downconverters 76 and 78 (the downconverted master AFS input 72 and spare AFS input 74) together with the voltage controlled crystal oscillator signal 36 and performs the prescribed functions in order to provide an appropriate voltage signal output 92 to the voltage controlled crystal oscillator 34 such that the phase of the crystal oscillator output 36 always tracks the phase of the master AFS input 72 regardless of which AFS input is used as the reference signal.

Basically, the preferred embodiment of the synthesizer control processor 90 includes a clock module 102 with an event clock generator 100 operating at an ideal frequency of 10.23 MHZ which is coupled to four other essential processor modules including, a phase and frequency module 104, a phase lock loop module 106, an I/O and control module 108, and a digital to analog conversion module 110. Each of these modules is described in more detail in the paragraphs that follow.

The function of the clock module 102 is to record (i.e. count) beat epochs which are generated from the zero crossings of the incoming signals. In particular, beat epochs are determined for the oscillator signal 36, the master AFS input 72, the spare AFS input 74, and a sample epoch which is generated every 102300 clock cycles.

Generally speaking, the phase and frequency module 104 performs three functions, including monitoring 112 of the AFS inputs, determining phase error 114 associated with the master AFS input, and estimating the phase and frequency 116 of the spare or secondary AFS input. Specifically, the phase and frequency module 104 estimates the phase and frequency of the various input signals and calculates the phase difference between the voltage controlled crystal oscillator signal 36 and the downconverted master AFS input 82, the phase difference between the downconverted spare AFS input 84 and the downconverted master AFS input 82, the frequency offset of the voltage controlled crystal oscillator signal, and the frequency offset of the spare AFS input. More importantly, it is the phase and frequency module 104 that determines, for purposes of switch-over, whether the master AFS input has failed or not, and if so, swaps the AFS inputs appropriately. In other words, the master AFS input becomes the secondary input and the spare AFS input becomes the primary input (i.e. new master AFS input). The output of the phase and frequency module 104 passes the phase difference between the voltage controlled crystal oscillator signal 36 and the master AFS input to the phase lock loop module 106. In addition, all four calculated values are concurrently routed to the I/O and Control module 108. Of particular importance are the calculated values of the phase difference between the spare AFS input and the master AFS input, the frequency offset of the voltage controlled crystal oscillator, and the frequency offset of the spare AFS input. These three calculated values are used whenever switch-over from the master AFS input to the spare AFS input is performed to provide the seamless switch-over feature.

Referring again to FIG. 3, the phase lock loop module 106 is adapted to receive as inputs the calculated phase difference 117 between the voltage controlled crystal oscillator and the master AFS input from the phase and frequency module as well as a phase offset command value, a current frequency offset command value, and an initial value of PLL filter output 119 from the I/O and control module. The phase lock loop module 106 is adapted to provide a loop filter output signal 125 to the digital to analog conversion module 110. The phase lock loop module 106 specifically includes a phase computation routine 118, a phase error limiting routine 120, and a second order loop filter routine 122 with a precharge circuit 124.

The function of the I/O and Control module 108 is to accept various input commands 130, to output diagnostic parameters 132, to communicate with other elements of the synthesizer system and/or satellite system (i.e. AFS selector switch, downconverters, etc.) 134, and route the synthesizer variables and parameters between the different modules of the processor. For purposes of the present discussion, the salient control commands processed by the I/O and Control module 108 include specific initiation commands and data as well as the switch-over commands. The I/O and Control module 108 is adapted to provide various output diagnostic parameters including such items as phase and frequency offsets, status flags, and error messages.

The digital to analog conversion module 110 accepts as input the loop filter output signal 125 from the phase lock loop module 106 and produces an analog voltage signal 92 which drives the voltage controlled crystal oscillator 34. The digital to analog conversion module 110 involves using a calibration look up table 136 which is used to determine the input to the digital to analog converter 138 based on the frequency and phase offset between the crystal oscillator and the AFS inputs.

Figure 4A:
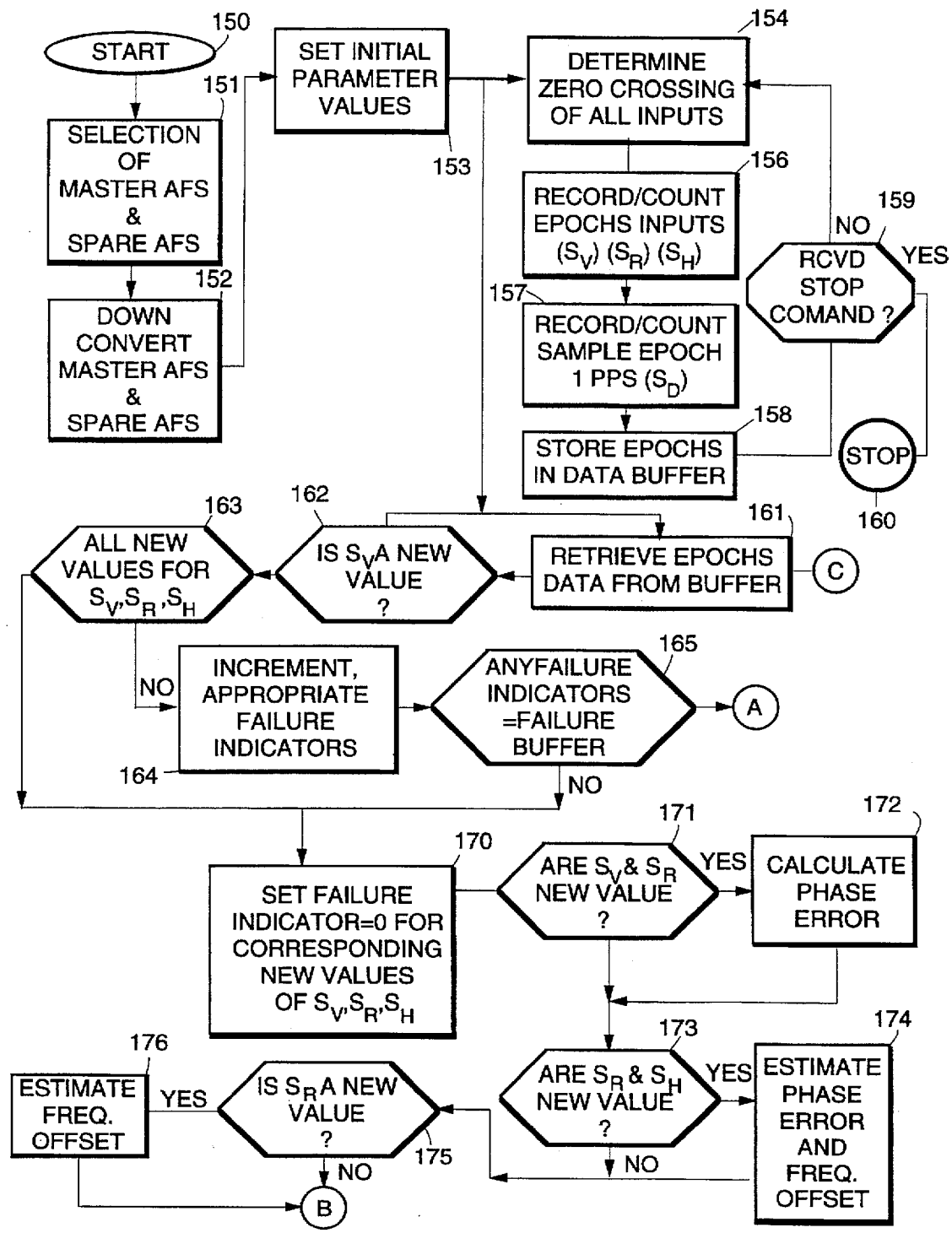
FIGS. 4a–4c together represent a detailed flow chart of the method by which seamless switch-over is accomplished using the synthesizer control processor of FIG. 3.
Figure 4B:
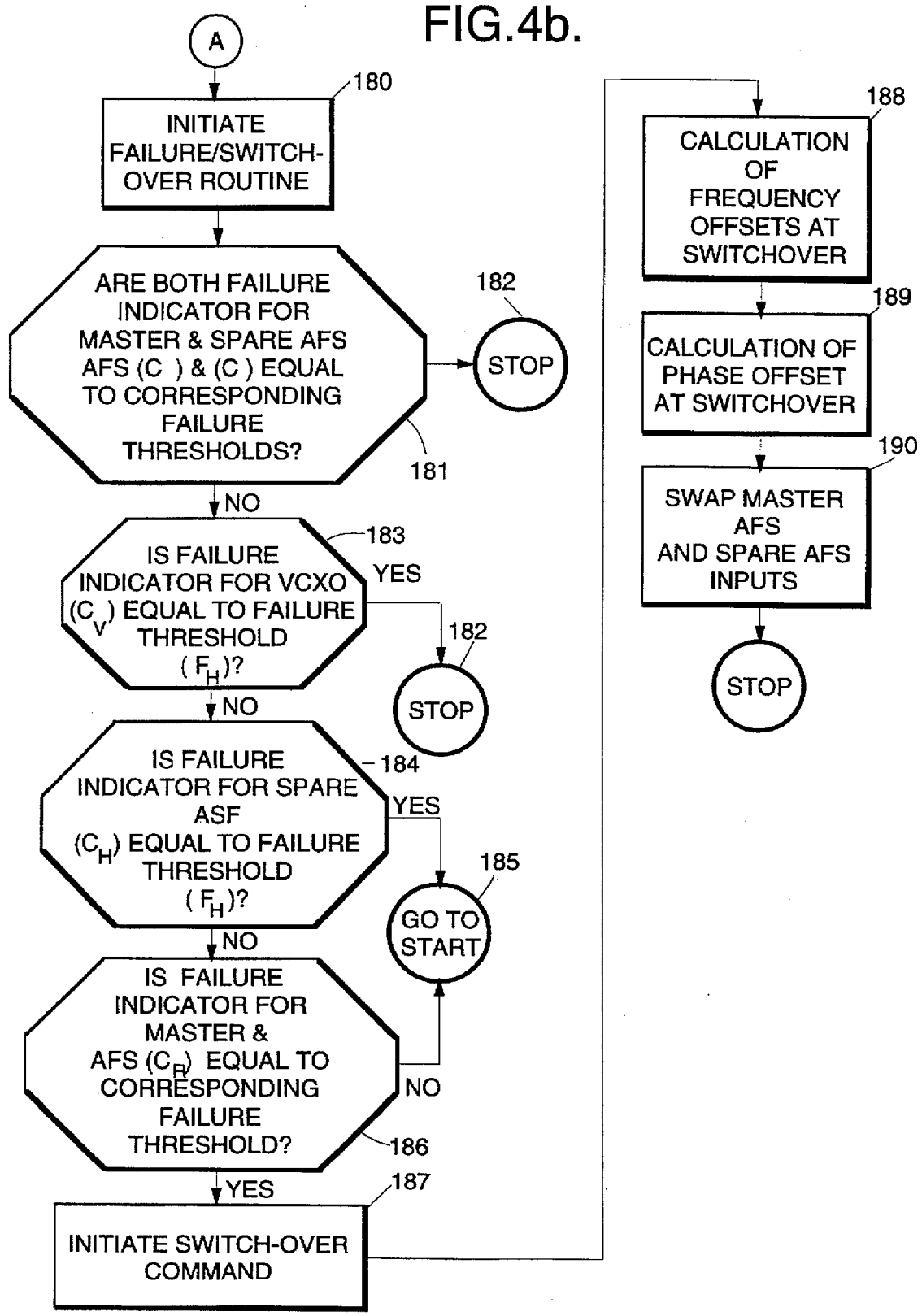
Figure 4C:
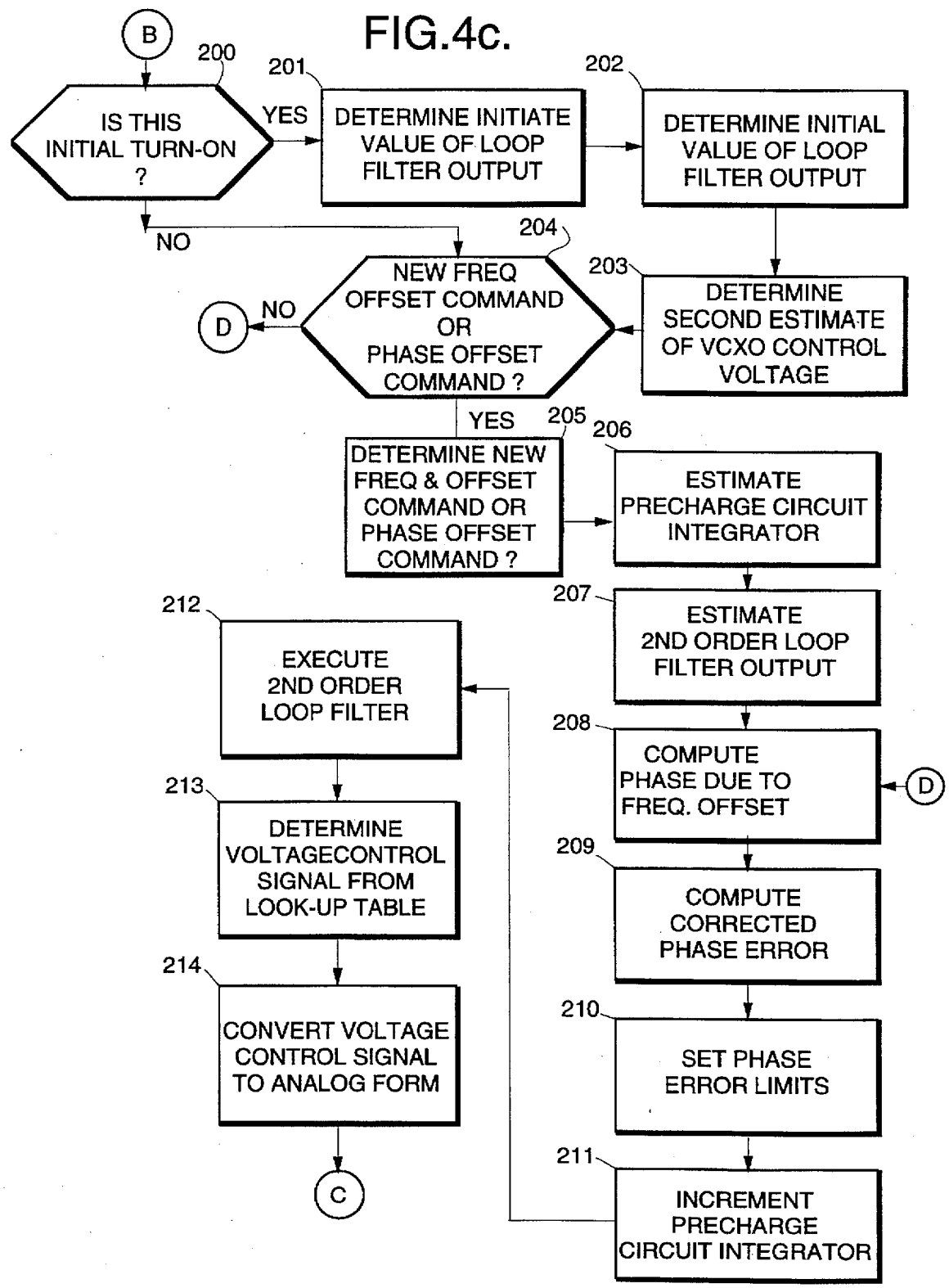

FIGS. 4a–4c depict a flow chart of the process for seamless switching using the synthesizer control processor described above. As seen therein, each of the five modules are separately identified with a reference numeral corresponding to those used in FIG. 3. In addition, each of the individual steps performed in the presently described process is identified by a block having a reference numeral associated therewith.

With reference to FIG. 4a, the present method of seamlessly switching from a master AFS input to a spare AFS input is initiated by the selection of a master AFS input and a spare AFS input from a plurality of N AFS inputs (block 151). Each of the two selected AFS inputs are then downconverted (block 152). The downconverted AFS inputs are then input to a synthesizer control processor that is adapted to perform the phase comparison functions, the digital phase lock loop functions, and digital to analog conversion functions to produce a voltage control signal that effectuates control over the voltage controlled crystal oscillator.

Specifically, the synthesizer control processor initially sets the processor parameters at prescribed values (block 153). The synthesizer processor parameters include: phase offset between master AFS and voltage controlled crystal oscillator ($P_V$), phase offset between master AFS and spare AFS ($P_H$), frequency offset of oscillator ($y_L$), frequency offset of spare AFS ($y_H$), a first counter representing the beat epochs of crystal oscillator ($S_V$) with a nominal period of 98 ns, a second counter representing the beat epochs of master AFS input ($S_R$) expressed in oscillator clock periods, a third counter representing the beat epochs of spare AFS input ($S_H$) expressed in oscillator clock periods, a fourth counter representing the beat epochs of a sample increment ($S_D$) generated once per second (i.e. once every 102300 clock cycles), failure threshold for crystal oscillator ($F_V$), failure threshold for master AFS input ($F_R$), failure threshold for spare AFS input ($F_H$), failure indicator for crystal oscillator ($C_V$), failure indicator for master AFS input ($C_R$), failure indicator for spare AFS input ($C_H$), phase offset command, frequency offset command, phase offset at switch-over, frequency offset at switch-over, PLL filter output, PLL error, PLL precharge value, PLL integrator value, and other defined parameters.

Having set the initial values of the processor parameters, the next step is to continually determine the zero crossings of master AFS, spare AFS and voltage controlled crystal oscillator (block 154) and record epochs ($S_V$), ($S_R$), and ($S_H$) from the zero crossings (block 156). After such epochs have been recorded, the next step is to record the sample epoch ($S_O$) (block 157). The epoch values are then stored in a data buffer (block 158) and the process loops back to block 154 unless a 'STOP' command is received (block 159) in which case the process is halted (block 160).

On a continuing basis, the sample epochs are retrieved from the data buffer (block 161). Every occurrence of a new sample epoch ($S_D$) (YES branch of block 162), the input signals are checked for failure. Failures are indicated by a repeating absence of change in the epochs ($S_V$), ($S_R$), and ($S_H$). Each of these epochs are checked to see if new values are present (block 163). If there is no new value for any of the epochs ($S_V$), ($S_R$), and ($S_H$) (NO branch of block 163), then the failure indicator for that channel ($C_V$), ($C_R$), and ($C_H$) is incremented (block 164). After the failure indicators have been incremented, the next step is to determine if any of the failure indicators ($C_V$), ($C_R$), and ($C_H$) are equal to the respective failure thresholds ($F_V$), ($F_R$), and ($F_H$) (block 165). If so, (YES branch of block 165), then a failure/switch-over routine is initiated, which is described more fully below. If the failure indicators ($C_V$), ($C_R$), and ($C_H$) are not equal to the respective failure thresholds ($F_V$), ($F_R$), and ($F_H$), (NO branch of block 165), the routine continues as if the epochs have changed without resetting the failure indicators. In the event that there is no new sample epoch ($S_O$) (NO branch of block 162), control loops back and retrieves the next set of epochs.

Finally, where any of the values of the epochs ($S_V$), ($S_R$), and ($S_H$) are new (YES branch of block 163), the first step is to reset the failure indicator corresponding to the changed epoch back to zero (block 170). The next step is to determine which of the three epochs ($S_V$), ($S_R$), and ($S_H$) have changed. If both ($S_V$) and ($S_R$) are new (YES branch of block 171), the synthesizer proceeds to calculate the phase offset between the master AFS and the voltage controlled crystal oscillator ($P_V$) (block 172). Next, it is determined if the integer values for both ($S_V$) and ($S_H$) are new (block 173). If so, the synthesizer proceeds to calculate a new value for the phase offset between the master AFS and the spare AFS ($P_H$) as well as new values for the fractional frequency offset of the spare AFS ($y_H$) (block 174). Still further, one must ascertain whether a new value for the epoch ($S_R$) is present (block 175), and if so, then calculate the fractional frequency offset of the local oscillator ($y_L$) (block 176).

Turning now to FIG. 4b, the failure/switch-over routine (block 180), when invoked, assesses whether any of the inputs, namely the spare AFS, master AFS or oscillator inputs, have failed. As indicated above, a failure is detected whenever any of the failure indicator values ($C_V$), ($C_R$), and ($C_H$) are greater than or equal to the respective failure threshold values ($F_V$), ($F_R$), and ($F_H$). If both failure indicators for the master AFS ($C_R$) and spare AFS ($C_H$) are equal to or exceed the respective failure thresholds ($F_R$) and ($F_H$) (block 181), the present process is halted (block 182). Similarly, if the failure indicator for the crystal oscillator ($C_V$) is equal to the failure threshold associated with the crystal oscillator ($F_V$) (block 183), then the present process is halted (block 182). If the failure indicator for the spare AFS ($C_H$) is equal to the failure threshold associated with the spare AFS ($F_H$) (block 184), a new spare AFS input must be selected (block 185). Lastly, if only the failure indicator for the master AFS ($C_R$) is equal to the corresponding failure threshold ($F_R$) (block 186), then switch-over between the master AFS and spare AFS is commanded (block 187).

The switch-over command initiates a sequence of steps including the calculation of the frequency offset ($y_o$) and frequency offset at switch-over ($y_{DO}$) (block 188). The next step is to perform a calculation of the phase offset ($P_O$) and phase offset at switch-over ($P_{DO}$) (block 189). All of these offset calculations (block 188 and block 189) utilize previously calculated values of the phase offset between the master AFS and the spare AFS ($P_H$) and fractional frequency offset of the spare AFS ($y_H$) together with the frequency offset command ($Y_D$) and the phase offset command ($P_D$) received from the I/O and Control module. After the offset calculations are performed, the synthesizer swaps the master AFS input and the spare AFS input (block 190) and the process continues with the phase lock loop functions.

Turning now to FIG. 4c, the phase lock loop portion of the present process first inquires whether this is an initial run or initial turn-on (block 200). If so, the process proceeds to determine an initial estimate of oscillator control voltage (block 201), determines an initial value of filter output (block 202), and determines a second estimate of voltage controlled crystal oscillator control voltage (block 203).

After these phase lock loop (PLL) initiation steps are performed or if it has been determined that this is not an initial run or initial turn-on (NO branch of block 200), then the PLL routine proceeds to determine whether a new frequency offset command ($y_D$) or Phase offset Command ($P_D$) has been input (block 204). If so, the next step is to determine new frequency and phase offset parameter values (block 205), and then estimate the precharge integrator (block 206), and estimate the second order loop filter output (block 207).

After the above determinations and estimates are made, or if no new commands were received (NO branch of block 204), then the PLL process enters its main loop. The main loop involves the steps of computing the phase due to the frequency offset ($y_O$)(block 208), computing the corrected phase error (block 209), setting phase error limits (block 210), incrementing PLL precharge integrator (block 211), and executing the second order loop filter to provide a refined filter output or oscillator control signal (block 212).

The output of the phase lock loop provides the oscillator control signal which is used to determine an appropriate voltage signal from a look up table (block 213). The values extracted from the look-up table are passed to a digital-to analog converter where an appropriate voltage signal is generated (block 214). The voltage signal is then routed to the voltage controlled crystal oscillator which in turn generates the desired output. The present process then loops back and retrieves another set of epochs from the data buffer (block 161) and the process continues.

Although the described process for seamlessly switching between AFS inputs is described with reference to a particular configuration of a synthesizer control processor, including a phase comparison system and PLL system, it is contemplated that a variety of different phase comparison systems and PLL systems could be used. With this in mind, the presently described process is in no way limited by the details of the synthesizer control processor described above. Rather, it is intended that the scope of the above described method or process be determined with reference to the appropriate claims.

Figure 5A:
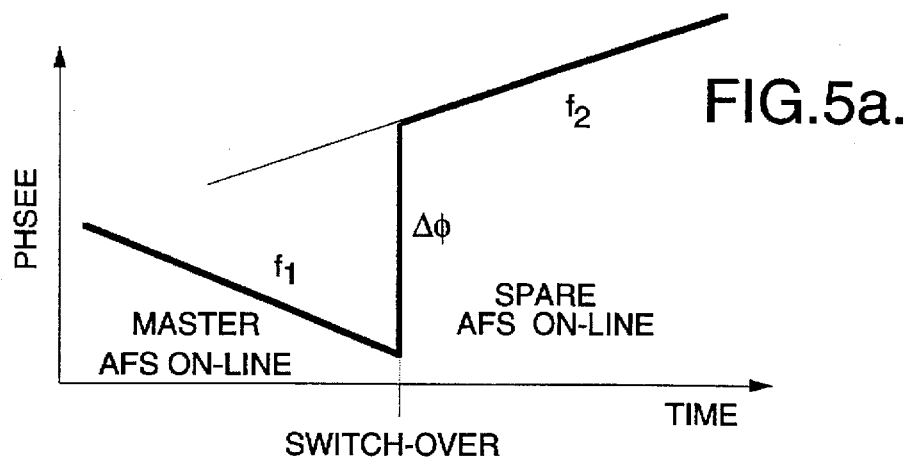
FIGS. 5a and 5b are graphical representations of a synthesizer output operating without the seamless switch-over feature of the present invention (FIG. 5a) and operating with the seamless switch-over feature of the present invention (FIG. 5b).
Figure 5B:
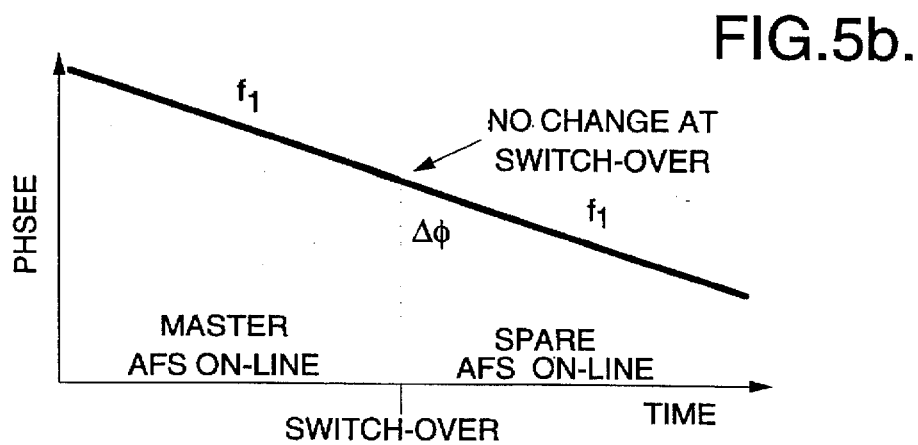

Referring next to FIG. 5, the estimated phase and frequency offsets are utilized to allow seamless switching of control of the voltage controlled crystal oscillator from the master or primary AFS input to the spare or secondary unit. In other words, when the master AFS input fails or is taken off-line, the spare AFS is utilized in its place. As one may expect, the phase and/or frequency of the spare AFS input presumably differs from the phase and/or frequency of the master AFS input. FIG. 5a illustrates a phase glitch and new frequency of operation that occurs when the phase and frequency offset of the pair of AFS inputs is not taken into consideration (non-seamless switching). FIG. 5b illustrates the glitch-free seamless switch-over that occurs when the synthesizer system utilizes the measured phase and frequency offsets between the AFS inputs of the present invention. By offsetting or adjusting the phase and/or frequency of the spare AFS input by an amount equal to the phase and frequency differences between the two AFS inputs when switch-over is commanded and the master AFS and spare AFS are swapped, a glitch free transition is observed. In other words, the frequency and phase offset between the two AFS inputs is factored in the digital phase lock process yielding an output signal with an adjusted phase which still tracks the phase of the master AFS input.

Advantageously, the seamless switching feature of the above-described synthesizer provides the desired output signal having a selected frequency and phase that always tracks a particular AFS even through AFS input glitches and short shut-downs. Further, the above-described synthesizer provides enhanced diagnostic capabilities because spare AFS units can be regularly tested without adverse operational impacts typically associated with switch-over. For example, the diagnostic capabilities allow the monitoring of multiple AFS units independent of the synthesizer tracking configuration for early detection of AFS problems before a hard failure. Still further, failed or off-line AFS units can still be closely monitored after they are taken off-line and even compared to the operating AFS units.

The present invention and its advantages will be understood from the foregoing description, and it will be apparent that various changes may be made in the form, construction and arrangement of the parts thereof without departing from the spirit and scope of the invention or sacrificing all of its material advantages, the forms hereinbefore described being merely exemplary embodiments thereof. To that end, it is not intended that the scope of the invention be limited to the specific embodiments and process illustrated and described. Rather, it is intended that the scope of this invention be determined by the appending claims and their equivalents.

What is claimed is:

1. A seamless switch-over synthesizer comprising:
   a phase comparison circuit for computing the phase difference between a reference input signal and a secondary input signal and for computing the phase difference between the reference input and a synthesizer output;
   a digital phase lock loop for phase locking the synthesizer output to the reference input based on the computed phase differences;
   a digital to analog converter for converting the output of the digital phase lock loop to an analog control signal; and
   a voltage controlled crystal oscillator adapted to receive the analog control signal and provide the synthesizer output;
   wherein the synthesizer output tracks the phase and frequency of the reference input and the synthesizer further provides seamless switching between reference input and secondary input with no change in the phase and frequency of the synthesizer output.

2. The seamless switch-over synthesizer of claim 1 further comprising an atomic frequency standard selector switch adapted for receiving as inputs a plurality of atomic frequency standard inputs and providing an output of at least two atomic frequency standards, one of which is the reference input and one of which is the secondary input.

3. The seamless switch-over synthesizer of claim 2 wherein the phase comparison circuit further comprises a downconverting circuit for reducing the frequency of the selected atomic frequency standard inputs prior to computing the phase differences.

4. The seamless switch-over synthesizer of claim 2 wherein the phase comparison circuit is a multichannel phase comparison system further adapted for monitoring the integrity of the atomic frequency standard inputs.

5. The seamless switch-over synthesizer of claim 1 wherein, prior to switching from the reference input to the secondary input, the digital phase lock loop phase locks the synthesizer output to the reference input based on a phase offset and a frequency offset computed from the phase difference between the synthesizer output and the reference input and at switch-over the digital phase lock loop phase locks the synthesizer output to the reference input based in part on an estimated phase offset and an estimated frequency offset determined from the phase difference between the reference input and the secondary input.

6. The seamless switch-over synthesizer of claim 1 wherein the digital phase lock loop further includes a phase error limiter.

7. The seamless switch-over synthesizer of claim 1 wherein the digital phase lock loop further includes a precharge circuit.

8. A timekeeping system adapted to utilize at least two atomic frequency standard inputs and produce a clock output that tracks the phase of one of the atomic frequency standard inputs and which exhibits seamless switch-over upon a transfer in atomic frequency standard inputs, the timekeeping system comprising:
   an atomic frequency standard selector switch adapted for receiving as inputs a plurality of atomic frequency standard inputs and providing an output of at least two atomic frequency standards, one of which is a primary atomic frequency standard input;
   a phase comparison subsystem coupled to the selector switch and adapted for computing the phase difference between the primary atomic frequency standard input signal and a secondary atomic frequency standard input signal and for computing the phase difference between the primary atomic frequency standard input and a timekeeping system output and for estimating the phase error and frequency offset of the atomic frequency standard inputs;
   a digital phase lock loop subsystem coupled to the phase comparison subsystem for phase locking the timekeeping system output to the primary atomic frequency standard input based on the computed phase differences and the estimated phase errors and frequency offsets;
   a digital to analog converter coupled to the digital phase lock loop subsystem for converting a digital phase loop output to a corresponding analog control signal; and
   a voltage controlled crystal oscillator coupled to the digital to analog converter, the voltage controlled crystal oscillator adapted to receive the analog control signal and provide the timekeeping system clock output in response thereto.

9. The timekeeping system of claim 8 wherein the phase comparison subsystem further comprises a pair of downconverters for reducing the frequency of the selected atomic frequency standard inputs prior to computing the phase error and frequency offsets.

10. The timekeeping system of claim 8 wherein prior to switching from the primary atomic frequency standard input to the secondary atomic frequency standard input, the digital phase lock loop phase locks the synthesizer output to the primary atomic frequency standard input based on a phase offset and a frequency offset computed from the phase difference between the timekeeping system output and the primary atomic frequency standard input and at switch-over the digital phase lock loop phase locks the timekeeping system output and the primary atomic frequency standard input based in part on an estimated phase offset and an estimated frequency offset determined from the phase difference between the primary atomic frequency standard input and the secondary atomic frequency standard input.

11. The timekeeping system of claim 8 further comprising a clock output distribution network for routing clock output to various elements within the timekeeping system.

12. The timekeeping system of claim 8 wherein the digital phase lock loop subsystem further includes a phase error limiter.

13. The timekeeping system of claim 8 wherein the digital phase lock loop subsystem further includes a precharge circuit.

14. In a timekeeping system, a method of switching from a primary atomic frequency standard input to a secondary atomic frequency standard input without affecting the phase and frequency of the timekeeping system output, the method comprising the steps of:

(a) measuring the phase difference between the primary and secondary atomic frequency standard inputs;

(b) estimating a phase offset and a frequency offset between the primary atomic frequency standard input and the secondary atomic frequency standard input;

(c) phase locking the timekeeping system output to the primary atomic frequency standard input based on a measured phase offset and a measured frequency offset between the timekeeping system output and the primary atomic frequency standard input prior to switching from a primary atomic frequency standard input to a secondary atomic frequency standard input; and (d) phase locking the timekeeping system output to the primary atomic frequency standard input based in part on an estimated phase offset and estimated frequency offset between the primary atomic frequency standard input and secondary atomic frequency standard input after switching from a primary atomic frequency standard input to a secondary atomic frequency standard input.

15. The method as set forth in claim 14 wherein the steps of phase locking the timekeeping system output to the primary atomic frequency standard input further comprise digitally phase locking the timekeeping system output to the primary atomic frequency standard input; and further comprising the step of converting the digitally phased locked signal to an analog control signal which provides the timekeeping system output that tracks the phase of the primary input.

16. The method as set forth in claim 14 further comprising the initial step of selecting the primary atomic frequency standard input and secondary atomic frequency standard input from a plurality of atomic frequency standard inputs.

17. The method as set forth in claim 14 further comprising the steps of monitoring the integrity of the primary and secondary atomic frequency standard inputs and commanding switch-over whenever the integrity of the primary atomic frequency standard input is lost.

* * * * *